(12) United States Patent
Matsuda et al.

(10) Patent No.: US 7,632,714 B2
(45) Date of Patent: Dec. 15, 2009

(54) METHOD FOR MANUFACTURING A DISPLAY DEVICE

(75) Inventors: Eisuke Matsuda, Kanagawa (JP); Keiichi Kagami, Miyagi (JP)

(73) Assignee: Sony Corporation, Tokyo (JP)

( * ) Notice: Subject to any disclaimer, the term of this patent is extended or adjusted under 35 U.S.C. 154(b) by 124 days.

(21) Appl. No.: 11/778,932

(22) Filed: Jul. 17, 2007

(65) Prior Publication Data
US 2008/0108157 A1    May 8, 2008

(30) Foreign Application Priority Data
Jul. 31, 2006    (JP)    ............................ 2006-207663

(51) Int. Cl.
*H01L 21/00*    (2006.01)
*H01J 1/62*    (2006.01)

(52) U.S. Cl. .............................. 438/116; 257/E33.001; 313/504

(58) Field of Classification Search ................. 438/116; 313/504; 257/E33.001
See application file for complete search history.

(56) References Cited

U.S. PATENT DOCUMENTS
2006/0138945 A1 *   6/2006   Wolk et al. .................. 313/506

FOREIGN PATENT DOCUMENTS
JP    2002-110350    4/2002
JP    2003-229259    8/2003
JP    2006-066375    3/2006

* cited by examiner

*Primary Examiner*—Davienne Monbleau
*Assistant Examiner*—Shweta Mulcare
(74) *Attorney, Agent, or Firm*—Sonnenschein Nath & Rosenthal LLP (57) ABSTRACT

There is provided a method for manufacturing a display device. The method includes the steps of: forming a bottom electrode for supplying a first charge, in individual pixels on a substrate; forming a pattern of a first light-emitting layer having a first-charge transport property above the bottom electrode in part of the pixels; subjecting the substrate having the first light-emitting layer formed thereon to heat treatment; forming a pattern of a second light-emitting layer having a second-charge transport property on the heat-treated surface above the bottom electrode in the other pixels; and forming a top electrode for supplying a second charge so that the first light-emitting layer and the second light-emitting layer are sandwiched between the bottom electrode and the top electrode.

6 Claims, 3 Drawing Sheets

METHOD FOR MANUFACTURING A DISPLAY DEVICE

BACKGROUND OF THE INVENTION

1. Field of the Invention

The present invention relates to a method for manufacturing a display device. More particularly, the present invention is concerned with a method for manufacturing a display device using an organic electroluminescent element, which method is advantageous in that, even when a light emitting layer is formed by a heat transfer method, the resultant display device can maintain satisfactorily high light emission efficiency and long brightness-half-life.

2. Description of Related Art

An organic electroluminescent element utilizing electroluminescence of an organic material has an organic layer composed of a stack of a hole transport layer, a light emitting layer, and others disposed between a bottom electrode and a top electrode, and has attracted attention as a light emitting element which can achieve light emission with high luminance by low-voltage direct driving.

A full color display device using such an organic electroluminescent element has organic electroluminescent elements individually having R (red), G (green), and B (blue) colors arranged on a substrate. In the manufacture of this display device, at least a light emitting layer composed of organic luminescent materials emitting light of the respective colors is necessarily patterned per electroluminescent element. Patterning the light emitting layer is performed by a shadow masking method in which a luminescent material is deposited or applied through a mask composed of, for example, a sheet having an opening pattern formed, or by an ink-jet method.

The patterning by a shadow masking method has problems in that it is difficult to form a finer opening pattern in the mask, and that patterning with high positioning precision for the electroluminescent element region is difficult due to the deflection or elongation of the mask, thus making it difficult to obtain further scaled-down organic electroluminescent elements with an increased degree of integration. In addition, a functional layer composed mainly of a previously formed organic layer is likely to suffer a damage due to the contact of the mask having an opening pattern formed, thus lowering the manufacturing yield.

Further, the patterning by an ink-jet method has a problem in that its limited patterning precision makes it difficult to obtain scaled-down electroluminescent elements with an increased degree of integration and to achieve a substrate having an increased size.

For solving the problems, as a new patterning method for a light emitting layer composed of an organic material or other functional layers, a transfer method using an energy source (heat source) (i.e., heat transfer method) has been proposed. The manufacture of a display device using the heat transfer method is, for example, conducted as follows. A bottom electrode is first formed on a substrate for display device (hereinafter, referred to as "device substrate"). Separately, a light emitting layer is deposited on another substrate (hereinafter, referred to as "transfer substrate") with a light-heat conversion layer placed therebetween. The device substrate and the transfer substrate are disposed so that the light emitting layer faces the bottom electrode, and the transfer substrate side is irradiated with a laser, so that the light emitting layer is heat-transferred onto the bottom electrode on the device substrate. In this instance, by scanning with a spot of the laser, the light emitting layer can be heat-transferred to only a predetermined region on the bottom electrode with high positioning precision (see Japanese Patent Application Publication (KOKAI) No. 2002-110350).

The use of a heat transfer method in the patterning is advantageous to scaling down of the electroluminescent element; however, the electroluminescent element obtained by this method has a problem in that the light emission efficiency and brightness-half-life are lower, as compared to the electroluminescent element manufactured by a shadow mask method.

For removing the problem, with respect to the method for manufacturing a display device using a heat transfer method, a method for improving the light emission efficiency and brightness-half-life has been proposed in which, prior to the heat transfer of the light emitting layer, the device substrate and transfer substrate (donor element) are subjected to heat treatment (see Japanese Patent Application Publication (KOKAI) No. 2003-229259). In addition, a method for improving the light emission efficiency and brightness life has been proposed in which, after the heat transfer, the display substrate is subjected to heat treatment to prevent the light emitting layer from deteriorating due to oxygen or water vapor (see Japanese Patent Application Publication (KOKAI) No. 2006-66375).

SUMMARY OF THE INVENTION

However, it is necessary to select the method of preventing the deterioration of properties due to the heat transfer depending on the properties of the luminescent material to be transferred, and therefore not all the electroluminescent elements are improved in light emission efficiency by the above procedure for heat treatment.

Accordingly, a task of the present invention is to provide a method for manufacturing a display device composed of a plurality of electroluminescent elements having different material properties arranged on a substrate, in which the display device advantageously can maintain high light emission efficiency and long brightness-half-life of the electroluminescent elements.

For achieving the above task, in the method for manufacturing a display device according to an embodiment of the present invention, a bottom electrode for supplying a first charge is first formed in individual pixels on a substrate. Then, a pattern of a first light-emitting layer having a first-charge transport property is formed by a transfer method above the bottom electrode in part of the pixels and then, the resultant substrate is subjected to heat treatment. Subsequently, a pattern of a second light-emitting layer having a second-charge transport property is formed on the heat-treated surface above the bottom electrode in the other pixels. Then, a top electrode for supplying a second charge is formed so that the first light-emitting layer and second light-emitting layer are sandwiched between the bottom electrode and the top electrode.

In this method, with respect to the first light-emitting layer having a first-charge transport property, the surface on the top side, that is, the surface on the side of the top electrode for supplying a second charge, which surface serves as an emission region in the first light-emitting layer, corresponds to the heat-treated and planarized surface. On the other hand, with respect to the second light-emitting layer having a second-charge transport property, the surface on the bottom side, that is, the surface on the side of the bottom electrode for supplying a first charge, which surface serves as an emission region in the second light-emitting layer, corresponds to the planarized surface formed in contact with the heat-treated underlying surface. Therefore, the emission region side of each light emitting layer can be planarized irrespective of charge transport property of the light emitting layer.

DETAILED DESCRIPTION OF THE INVENTION

Hereinbelow, an embodiment of the present invention will be described with reference to the accompanying drawings. In the following embodiment, an example of application of the present invention to a manufacturing method of a full color display device composed of organic electroluminescent elements individually having red (R), green (G), and blue (B) colors arranged on a substrate is described with reference to the cross-sectional views of FIGS. 1 to 3.

Figure 1A:
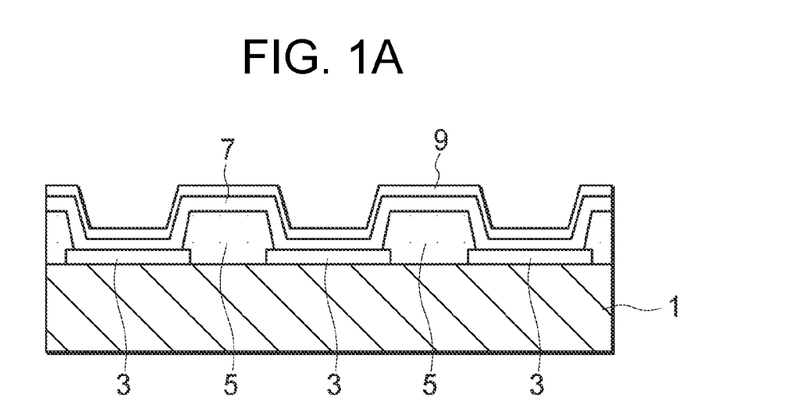
FIGS. 1A to 1C are cross-sectional views showing the steps (No. 1) in a method for manufacturing a display device according to an embodiment of the present invention.

First, as shown in FIG. 1A, a substrate 1 on which organic electroluminescent elements will be arranged is prepared. The substrate 1 is composed of a glass, silicon, or plastic substrate or a thin film transistor (TFT) substrate having a TFT formed thereon. Particularly, when the display device manufactured here is of a transmissive type that emits light through the substrate 1, the substrate 1 is composed of a material having light transmission properties.

Then, a bottom electrode 3 for supplying a first charge is formed and patterned in individual pixels on the substrate 1. When the first charge is a positive charge, the bottom electrode 3 is formed as an anode. On the other hand, when the first charge is a negative charge, the bottom electrode 3 is formed as a cathode.

The bottom electrode 3 is patterned in a form suitable for a driving mode of the display device manufactured. For example, when the driving mode of the display device is a passive matrix mode, the bottom electrode 3 is patterned in a form of, for example, stripes continuously extending in a plurality of pixels. On the other hand, when the driving mode of the display device is an active matrix mode having a TFT per pixel, the bottom electrode 3 is patterned in a form corresponding to the individual arranged pixels so that the patterned bottom electrode is connected individually to the TFTs similarly formed in the individual pixels through contact holes (not shown) formed in an interlayer dielectric covering the TFTs.

In the bottom electrode 3, a material appropriately selected depending on an emission type of the display device manufactured is used. Specifically, when the display device is of a top emission type that emits light through the side opposite the substrate 1, the bottom electrode 3 is composed of a highly reflective material. On the other hand, when the display device is of a transmissive type that emits light through the substrate 1 or of a both-side emission type, the bottom electrode 3 is composed of a light transmitting material.

For example, in the present embodiment, the display device is of a top emission type, the first charge is a positive charge, and the bottom electrode 3 is used as an anode. In this case, the bottom electrode 3 is composed of a conductive material having a high reflectance, such as silver (Ag), aluminum (Al), chromium (Cr), iron (Fe), cobalt (Co), nickel (Ni), copper (Cu), tantalum (Ta), tungsten (W), platinum (Pt), or gold (Au), or an alloy thereof.

When the display device is of a top emission type and the bottom electrode 3 is used as a cathode (namely, the first charge is a negative charge), the bottom electrode 3 is composed of a conductive material having a small work function. As the conductive material, an alloy of an active metal, such as Li, Mg, or Ca, and a metal, such as Ag, Al, or In, or a stacked structure thereof can be used. Alternatively, a structure may be used such that a thin compound layer composed of an active metal, such as Li, Mg, or Ca, and a halogen, such as fluorine or bromine, or oxygen is inserted between the bottom electrode and a functional layer 4.

On the other hand, when the display device is of a transmissive type or a both-side emission type and the bottom electrode 3 is used as an anode, the bottom electrode 3 is composed of a conductive material having a high transmittance, such as ITO (indium-tin-oxide) or IZO (indium-zinc-oxide).

When an active matrix mode is employed as a driving mode of the display device manufactured, for securing high aperture ratio for the organic electroluminescent elements, it is desired that the display device is of a top emission type.

Next, the bottom electrode 3 (anode, herein) is formed and then, an insulating film 5 is patterned so that the insulating film covers the edges of the patterned bottom electrode 3. Thus the portions of the bottom electrode 3 exposed through opening formed in the insulating film 5 correspond to pixel regions in which organic electroluminescent elements are individually formed. The insulating film 5 is composed of an organic insulating material, such as polyimide or a photoresist, or an inorganic insulating material, such as silicon oxide.

Then, a first-charge injection layer (i.e., hole injection layer) 7 is formed as a common layer covering the bottom electrode 3 and the insulating film 5. The hole injection layer 7 is composed of a general hole injection material, for example, m-MTDATA {4,4,4-tris(3-methylphenylphenylamino)triphenylamine} deposited 10 nm in thick.

Next, a first-charge transport layer (i.e., hole transport layer) 9 is formed as a common layer covering the hole injection layer 7. The hole transport layer 9 is composed of a general hole transport material, for example, α-NPD {4,4-bis(N-1-naphthyl-N-phenylamino)biphenyl} deposited 35 nm in thick. As a general hole transport material constituting the hole transport layer 9, for example, a benzidine derivative, a styrylamine derivative, a triphenylmethane derivative, a hydrazone derivative or the like is used.

Each of the hole injection layer 7 and the hole transport layer 9 may be of a stacked structure having a plurality of layers.

Figure 1B:
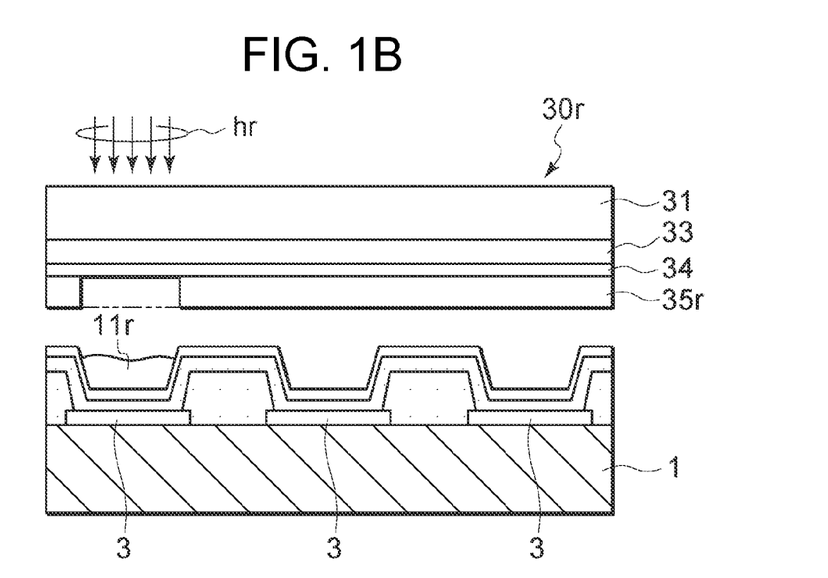

Then, as shown in FIG. 1B, a pattern of a red light-emitting layer 11r as a first light-emitting layer having a hole (first charge) transport property is formed above the bottom electrode 3 in part of the pixels. The red light-emitting layer 11r is formed by a transfer method as follows.

A transfer substrate 30r is first prepared. The transfer substrate 30r has a transfer layer (red transfer layer) 35r, for forming a red light-emitting layer, formed on the entire surface of a glass substrate 31 having substantially the same form as that of the substrate 1 for display device with a light-heat conversion layer 33 and an oxidation protecting layer 34 arranged in between.

As a material constituting the light-heat conversion layer 33, preferably used is a material having a low reflectance with respect to the wavelength range of a laser used as a heat source in a heat transfer step following thereto. For example, when a laser having a wavelength of about 800 nm from a solid-state laser source is used, a material having a low reflectance and a high melting point, such as chromium (Cr) or molybdenum (Mo), is preferred, but the material is not limited to these. Here, for example, the light-heat conversion layer 33 composed of Mo having a thickness of 200 nm is formed by a sputtering process.

Examples of materials constituting the oxidation protecting layer 34 include $SiN_x$, $SiO_2$, etc. Here, the oxidation protecting layer 34 is formed using, e.g., a chemical vapor deposition (CVD) process.

The red transfer layer 35r is composed mainly of a host material having a hole transport property and a red light-emitting guest material. The guest material may be of either fluorescence or phosphorescence, but preferred is that of fluorescence which can be easily controlled in light emission properties.

The red transfer layer 35r is composed of, for example, α-NPD (α-naphthyl phenyl diamine), which is a hole transport material, as a host material containing 2,6-bis[(4'-methoxydiphenylamino)styryl]-1,5-dicyanonaphthalene (BSN) as a red light-emitting guest material in an amount of 30% by weight, and has a thickness of about 45 nm.

The transfer substrate 30r having the above-described construction is arranged opposite the substrate 1 having the hole transport layer 9 formed thereon. In this instance, the transfer substrate 30r and substrate 1 are disposed so that the red transfer layer 35r faces the hole transport layer 9 and the substrate 1 and the transfer substrate 30r are in contact. Even in such an arrangement, the red transfer layer 35r is supported by the insulating film 5 on the substrate 1, so that the transfer substrate 30r is not in contact with the portion of the hole transport layer 9 above the bottom electrode 3.

Next, the thus arranged transfer substrate 30r opposite the substrate 1 is irradiated with a laser hr having, e.g., a wavelength of 800 nm. In this instance, a spot of laser hr is selectively emitted to a portion corresponding to the pixel on which a red electroluminescent element will be formed.

In the irradiation, the light-heat conversion layer 33 absorbs the laser hr and, utilizing the resultant heat, the red transfer layer 35r is heat-transferred to the substrate 1. The red transfer layer 35r is heat-transferred with high positioning precision onto the hole transport layer 9 deposited on the substrate 1, thus forming a pattern of a red light-emitting layer 11r having a hole transport property.

In the heat transfer, for example, the concentration gradient of the materials constituting the red transfer layer 35r on the transfer substrate 30r can be controlled by changing radiation energy of the laser hr. Specifically, by using a laser having high radiation energy, the red light-emitting layer 11r is formed from the red transfer layer 35r in the form of a mixed layer for which materials are substantially uniformly mixed with each other.

Further, it is important to perform radiation of the laser hr in a condition such that, in the portion on which a red electroluminescent element will be formed (pixel region), the bottom electrode 3 exposed through the insulating film 5 is completely covered with the red light-emitting layer 11r.

Figure 1C:
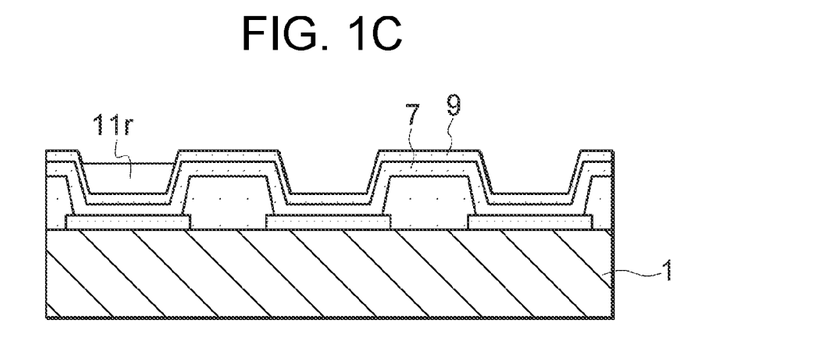

Next, as shown in FIG. 1C, the substrate 1 having the red light-emitting layer 11r formed thereon is subjected to heat treatment. In this instance, the heat treatment is conducted at a temperature which is lower than the melting temperature of each of the organic materials constituting the organic material layers formed on the substrate 1, that is, the hole injection layer 7, the hole transport layer 9, and the red light-emitting layer 11r, and which is near the glass transition temperature of each of the organic materials constituting the hole transport layer 9 and the red light-emitting layer 11r. Accordingly, the exposed surface of the hole transport layer 9 and the red light-emitting layer 11r is planarized.

The temperature near the glass transition temperature herein may be a temperature at which the organic materials constituting the hole transport layer 9 and red light-emitting layer 11r can move, and the temperature is within ±30° C. of the middle temperature between the glass transition temperature of the organic material mainly constituting the hole transport layer 9 and the glass transition temperature of the organic material mainly constituting the red light-emitting layer 11r.

For example, in the present embodiment, α-NPD is used as a main material constituting the hole transport layer 9 and red light-emitting layer 11r, and it has a glass transition temperature of 96° C. Therefore, the heat treatment is conducted at a temperature in the range of 96±30° C., for example, at 100° C. for about 30 minutes. The heat treatment is conducted in an atmosphere of inert gas or in a vacuum.

Figure 2A:
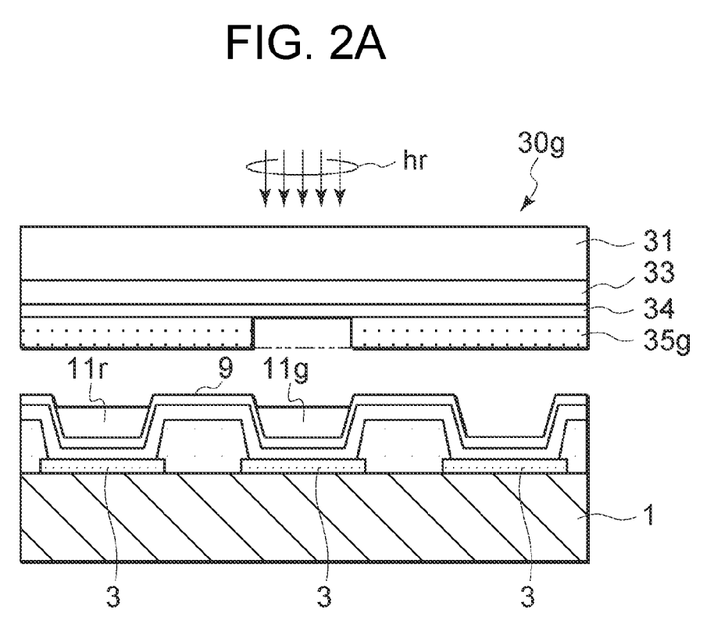
FIGS. 2A and 2B are cross-sectional views showing the steps (No. 2) in the method.
Figure 2B:
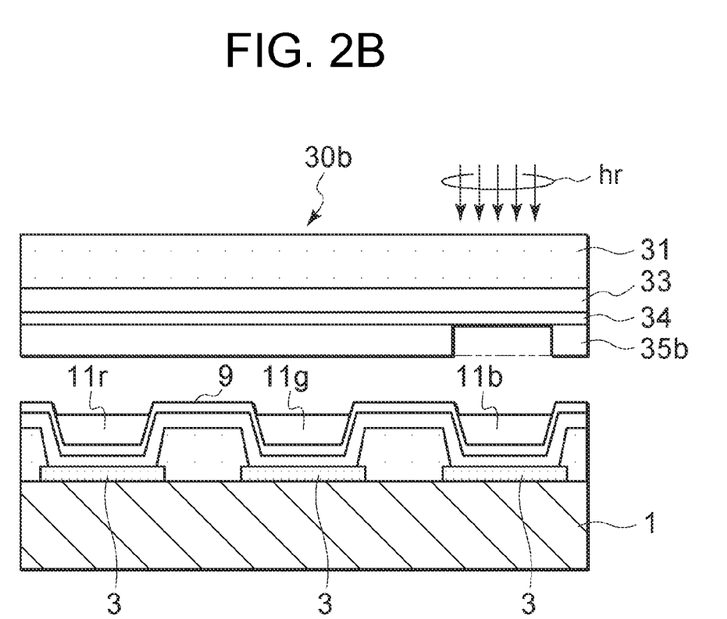

Then, as shown in FIGS. 2A and 2B, on the heat-treated surface above the bottom electrode 3 in the other pixels on which the red light-emitting layer 11r is not formed, as a second light-emitting layer having an electron (second charge) transport property, a pattern of a green light-emitting layer 11g and a pattern of a blue light-emitting layer 11b are successively formed. The green light-emitting layer 11g and the blue light-emitting layer 11b are successively formed by the transfer method in a manner similar to the formation of the red light-emitting layer 11r.

For example, as shown in FIG. 2A, a transfer substrate 30g for forming the green light-emitting layer 11g is first prepared. The transfer substrate 30g is composed of a transfer layer (green transfer layer) 35g, for forming the green light-emitting layer 11g, formed on the entire surface of a glass substrate 31 having substantially the same form as that of the substrate for display device with a light-heat conversion layer 33 and an oxidation protecting layer 34 arranged in between. The constructions of the layers in the transfer substrate 30g other than the green transfer layer 35g may be similar to those in the transfer substrate 30r described above with reference to FIG. 1B.

In this instance, the green transfer layer 35g is composed mainly of a host material having an electron transport property and a green light-emitting guest material. The host material may have a higher electron transport property, as compared to the material constituting the hole transport layer 9. Specifically, the host material used in the green material layer has an energy level of the highest occupied molecular orbital (hereinafter, referred to simply as "HOMO") lower than the level of the HOMO of α-NPD constituting the hole transport layer 9, and, more specifically, the difference between them may be 0.2 eV or more. The guest material may be of either fluorescence or phosphorescence, but preferred is that of fluorescence which can be easily controlled in light emission properties.

The light-emitting transfer layer 35g is comprised of, for example, ADN (anthracene dinaphthyl) as a host material having an electron transport property containing coumarin 6 as a green light-emitting guest material in an amount of 5% by weight, and is a film having a thickness of about 30 nm formed by vapor deposition.

Then, the transfer substrate 30g is arranged opposite the substrate 1 having the hole transport layer 9 and red light-emitting layer 11r formed thereon, and a spot of laser hr is selectively emitted through the transfer substrate 30g to a portion corresponding to the pixel on which a green electroluminescent element will be formed.

Thus, the green transfer layer 35g is selectively heat-transferred onto the hole transport layer 9 deposited on the substrate 1, forming a pattern of the green light-emitting layer 11g. Similarly to the heat transfer in forming the pattern of the red light-emitting layer 11r described above with reference to FIG. 1C, the heat transfer is conducted so that the green light-emitting layer 11g is formed from the green transfer layer 35g for which materials are substantially uniformly mixed with each other.

Then, as shown in FIG. 2B, a transfer substrate 30b for forming the blue light-emitting layer 11b is prepared. The transfer substrate 30b has a transfer layer (blue transfer layer) 35b, for forming the blue light-emitting layer 11b, formed on the entire surface of a glass substrate 31 having substantially similar form to that of the substrate for display device with a light-heat conversion layer 33 and an oxidation protecting layer 34 arranged in between. The constructions of the layers in the transfer substrate other than the blue transfer layer 35b may be similar to those in the transfer substrate 30r described above with reference to FIG. 1B.

The blue transfer layer 35b is composed mainly of a host material having an electron transport property and a blue light-emitting guest material. Similarly to the host material in the above green transfer layer 35g, the host material may have a higher electron transport property, as compared to the material constituting the hole transport layer 9. The guest material may be of either fluorescence or phosphorescence, but preferred is that of fluorescence which can be easily controlled in light emission properties.

The blue transfer layer 35b is composed of, for example, ADN (anthracene dinaphthyl) as a host material having an electron transport property containing 4,4'-bis[2-{4-(N,N-diphenylamino)phenyl}vinyl]biphenyl (DPAVBi) as a blue light-emitting guest material in an amount of 2.5% by weight, and is a film having a thickness of about 30 nm formed by vapor deposition.

Then, the transfer substrate 30b is arranged opposite the substrate 1 having the hole transport layer 9, the red light-emitting layer 11r, and the green light-emitting layer 11g formed thereon, and a spot of laser hr is selectively emitted through the transfer substrate 30b to a portion corresponding to the pixel on which a blue electroluminescent element will be formed.

Thus the blue transfer layer 35b is selectively heat-transferred onto the hole transport layer 9 deposited on the substrate 1, forming a pattern of the blue light-emitting layer 11b. Similarly to the heat transfer in forming the pattern of the red light-emitting layer 11r described above with reference to FIG. 1C, the heat transfer is conducted so that the blue light-emitting layer 11b is formed from the blue transfer layer 35b for which materials are substantially uniformly mixed with each other.

The steps for heat transfer repeatedly conducted as mentioned above can be performed under the atmospheric pressure, but they are desirably performed in a vacuum. In vacuum, heat transfer can be conducted with a laser having lower energy, making it possible to reduce the thermal adverse effect on the light emitting layer to be transferred. Further, the step for heat transfer conducted in vacuum advantageously improves the adhesion between the substrates, thus achieving excellent pattern precision in the transfer. In addition, when the all steps in the process for manufacturing a device are conducted continually in vacuum, the elements can be prevented from deteriorating.

Figure 3A:
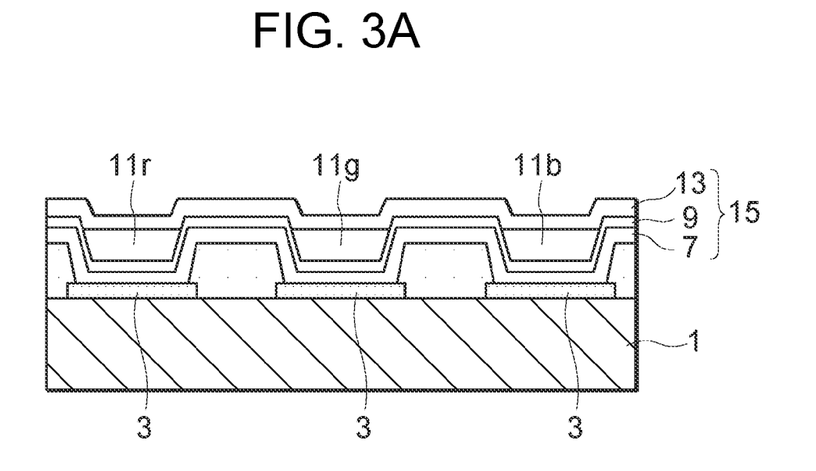
FIGS. 3A and 3B are cross-sectional views showing the steps (No. 3) in the method.

Subsequently, as shown in FIG. 3A, a second-charge transport layer (i.e., electron transport layer) 13 is deposited so that it covers the entire surface of the substrate 1 having the respective color light-emitting layers 11r, 11g, 11b formed thereon. The electron transport layer 13 is formed by vapor deposition as a common layer on the entire surface of the substrate 1. The electron transport layer 13 is composed of a general electron transport material, for example, 8-hydroxyquinoline aluminum ($Alq_3$) deposited about 20 nm in thick.

The thus formed hole injection layer 7, hole transport layer 9, respective color light-emitting layers 11r, 11g, 11b, and electron transport layer 13 constitute an organic layer 15.

Figure 3B:
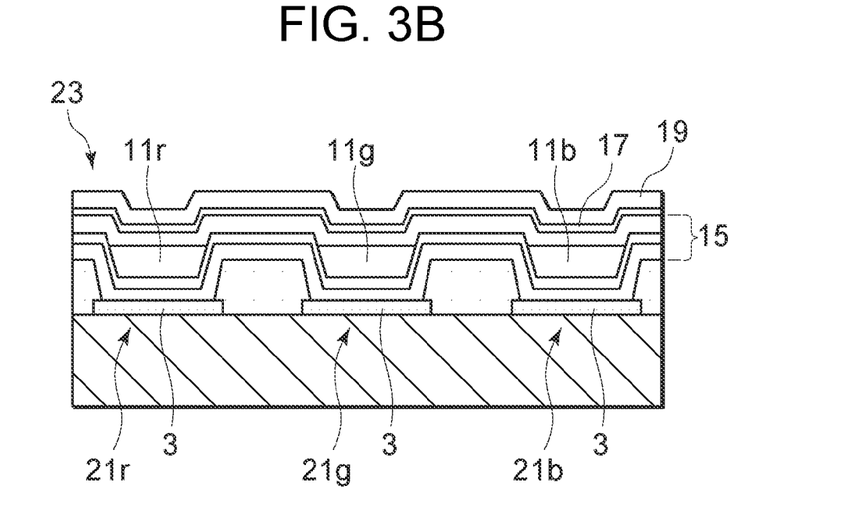

Then, as shown in FIG. 3B, a second-charge injection layer (i.e., electron injection layer) 17 is deposited on the electron transport layer 13. The electron injection layer 17 is formed by vapor deposition as a common layer on the entire surface of the substrate 1. The electron injection layer 17 is composed of a general electron injection material, for example, LiF deposited about 0.3 nm in thick by a vacuum deposition process (deposition rate: 0.01 nm/sec).

Then, a top electrode 19 is formed on the electron injection layer 17. The top electrode 19 is used as a cathode when the bottom electrode 3 is an anode, or used as an anode when the bottom electrode 3 is a cathode. The top electrode is formed as a cathode in the present embodiment.

When the display device to be manufactured is driven by a passive matrix mode, the top electrode 19 is formed in, for example, stripes which cross the stripes of the bottom electrode 3. On the other hand, when the display device is driven by an active matrix mode, the top electrode 19 is formed in a solid film covering the entire surface of the substrate 1 and serves as a common electrode to the individual pixels. In this case, an auxiliary electrode (not shown) is formed at the same level of the layer of bottom electrode 3, and the top electrode 19 is connected to the auxiliary electrode, thus making it possible to prevent the voltage of the top electrode 19 from dropping.

A red electroluminescent element 21r, a green electroluminescent element 21g, and a blue electroluminescent element 21b are respectively formed in the portions of the organic layer 15 which respectively contain the light emitting layers 11r, 11g, 11b, and which are sandwiched between the bottom electrode 3 and the top electrode 19 crossing to each other.

In the top electrode 19, a material appropriately selected depending on the emission type of the display device manufactured is used. Specifically, when the display device is of a top emission type that emits light from the individual light emitting layers 11r, 11g, 11b through the side opposite the substrate 1 or of a both-side emission type, the top electrode 19 is composed of a light transmitting material or light semi-transmitting material. On the other hand, when the display device is of a transmissive type that emits light through the substrate 1, the top electrode 19 is composed of a highly reflective material.

Here, the display device is of a top emission type and the bottom electrode 3 is used as an anode electrode, and therefore the top electrode 19 is used as a cathode electrode. In this case, for permitting the top electrode 19 to efficiently inject electrons to the organic layer 15, the top electrode 19 is formed using a material having excellent light transmission properties selected from the materials having a small work function mentioned in connection with the step for forming the bottom electrode 3.

For example, the top electrode 19 is formed by a vacuum deposition process as a common cathode composed of MgAg having a thickness of 10 nm. In this case, the top electrode 19 is formed by a method in which the film forming particles have such small energy that the particles do not adversely affect the underlying layer, e.g., a deposition process or a CVD (chemical vapor deposition) process.

When the display device is of a top emission type, it is preferred that the top electrode 19 is composed of a light semi-transmitting material and a resonator structure is formed between the top electrode 19 and the bottom electrode 3, achieving a design that improves the intensity of emitted light.

When the display device is of a transmissive type and the top electrode 19 is used as a cathode electrode, the top electrode 19 is composed of a conductive material having a small work function and a high reflectance. When the display device is of a transmissive type and the top electrode 19 is used as an anode electrode, the top electrode 19 is composed of a conductive material having a high reflectance.

The organic electroluminescent elements 21r, 21g, 21b emitting respective color light are formed as mentioned above and then, a not shown protective film is formed to cover the top electrode 19. The protective film is formed for the purpose of preventing moisture from penetrating the organic layer 15, and is formed from a material having low water permeability or low water absorption and has a satisfactory thickness. When the display device manufactured is of a top emission type, the protective film is composed of a material transmitting the light emitted from the respective color light-emitting layers 11r, 11g, 11b, and has a transmittance of, for example, at least about 80%.

The protective film may be composed of an insulating material. When the protective film is composed of an insulating material, an inorganic, amorphous insulating material, such as amorphous silicon ($\alpha$-Si), amorphous silicon carbide ($\alpha$-SiC), amorphous silicon nitride ($\alpha$-Si$_{1-x}$N$_x$), or amorphous carbon ($\alpha$-C), can be preferably used. Such an inorganic, amorphous insulating material constitutes no grain and hence has low water permeability, and serves as an excellent protective film.

For example, when a protective film composed of amorphous silicon nitride is formed, a protective film having a thickness of 2 μm to 3 μm is formed by a CVD process. In this instance, for preventing lowering of the luminance due to the deterioration of the organic layer 15, the deposition temperature is desirably room temperature, and further, for preventing the protective film from peeling, it is desired to form the protective film under deposition conditions such that the stress applied to the film is minimized.

When the display device to be manufactured is driven by an active matrix mode and the top electrode 19 is formed as a common electrode covering the entire surface of the substrate 1, the protective film may be comprised of a conductive material. When the protective film is composed of a conductive material, a transparent conductive material, such as ITO or IXO, is used.

The individual layers covering the respective color light-emitting layers 11r, 11g, 11b are formed in a solid film without using a mask. In addition, the formation of these layers is preferably conducted continually in the same deposition apparatus, desirably without being exposed to air, thus making it possible to prevent deterioration of the organic layer 15 due to the moisture in air.

With respect to the substrate 1 having the protective film formed thereon, a protective substrate is attached to the protective film through a bonding resin material. As a bonding resin material, for example, an ultraviolet curing resin is used. As a protective substrate, for example, a glass substrate is used. When the display device manufactured is of a top emission type, it is necessary that each of the bonding resin material and the protective substrate be composed of a material having light transmission properties.

Thus a full color display device 23 having the electroluminescent elements 21r, 21g, 21b emitting respective color light arranged on the substrate 1 is completed.

In the method described above, immediately after the respective color light-emitting layers are individually transferred, the substrate having the transferred layers is heated. As shown below, the working Examples have confirmed that the resultant organic electroluminescent elements have higher light emission efficiency and reduced driving voltage as well as longer brightness-half-life, as compared to the organic electroluminescent elements formed by a related art method using no heating step for substrate.

Therefore, in the above-described embodiment, patterns of the respective color light-emitting layers 11r, 11g, 11b can be formed with high positioning precision by a heat transfer method.

In the red light-emitting layer 11r having a hole transport property, holes injected from the bottom electrode (anode) 3 are transported within the red light-emitting layer 11r. The holes are recombined with electrons injected from the top electrode (cathode) 19 in a region of the red light-emitting layer 11r on the side of the top electrode (cathode) 19. For this reason, in the red light-emitting layer 11r having a hole transport property, the top side near the top electrode (cathode) 19 serves as an emission region.

Particularly in the above-mentioned embodiment, as described with reference to FIG. 1C, the red light-emitting layer 11r having a hole transport property is formed on the hole transport layer 9 and then the heat treatment is conducted, thus planarizing the top side of the red light-emitting layer 11r, namely, the side serving as an emission region.

On the other hand, in the green light-emitting layer 11g and blue light-emitting layer 11b having an electron transport property, electrons injected from the top electrode (cathode) 19 are transported within the light emitting layers 11g, 11b. The electrons are recombined with holes injected from the bottom electrode (anode) 3 in a region of the light emitting layers 11g, 11b on the side of the bottom electrode (anode) 3. For this reason, in the light emitting layers 11g, 11b having an electron transport property, the bottom side near the bottom electrode (anode) 3 serves as an emission region.

In the above-mentioned embodiment, as described with reference to FIG. 2A, the green light-emitting layer 11g and the blue light-emitting layer 11b having an electron transport property are formed on the hole transport layer 9 planarized by the heat treatment, thus planarizing the bottom side of the green light-emitting layer 11g and blue light-emitting layer 11b, namely, the side serving as an emission region.

The emission region side of each of the red light-emitting layer 11r having a hole transport property and the light emitting layers 11g, 11b having an electron transport property can be planarized as mentioned above, and hence, in the display device 23 having a plurality of electroluminescent elements 21r, 21g, 21b having different material properties arranged on the substrate 1, both excellent light emission efficiency and long brightness-half-life can be maintained according to the properties of the individual electroluminescent elements 21r, 21g, 21b.

Consequently, even when the light emitting layers are formed by a heat transfer method which, for example, has excellent positioning precision but lower light emission properties, the resultant electroluminescent elements can individually maintain both high light emission efficiency and long brightness-half-life, thus making it possible to achieve a display device using further scaled-down organic electroluminescent elements and having improved display properties.

In the above embodiment, the case is described in which the first charge is a positive charge, the second charge is a negative charge, the bottom electrode 3 is used as an anode, and the top electrode 19 is used as a cathode. However, the present invention can be applied to a case in which the first charge is a negative charge, the second charge is a positive charge, the bottom electrode 3 is used as a cathode, and the top electrode 19 is used as an anode. In this case, the layers 7 to 17 between the bottom electrode 3 and the top electrode 19 are stacked in the inverse order, and the procedure for forming these layers may be conducted in the inverse order.

Specifically, a bottom electrode is formed on the substrate 1 as a cathode and then, if necessary, an electron injection layer and an electron transport layer are formed in this order. Then, patterns of a green light-emitting layer and a blue light-emitting layer having an electron transport property are successively formed by a transfer method on the resultant surface, followed by heat treatment. The heat treatment is conducted at a temperature which is lower than the melting temperature of each of the organic materials constituting the organic material layers previously formed on the substrate 1, that is, the electron transport layer, the blue light-emitting layer, and the green light-emitting layer, and which is near the glass transition temperature of each of the organic materials constituting these layers. Accordingly, the exposed surface of the electron transport layer, blue light-emitting layer, and green light-emitting layer is planarized.

For example, when ADN (anthracene dinaphthyl) having a glass transition temperature of 106° C. is used as a main material constituting the electron transport layer, blue light-emitting layer, and green light-emitting layer, the heat treatment is conducted at, e.g., 110° C. for about 30 minutes.

Subsequently, a pattern of a red light-emitting layer having a hole transport property is formed on the electron transport layer by a transfer method, and then a hole transport layer, a hole injection layer, and a top electrode as an anode are formed.

Further, the present invention described in the above embodiment is effective not only in the above-mentioned element having a common layer separated but also in a tandem-type organic EL element comprising stacked organic layer units having a light emitting layer (light emitting units) described in, for example, Japanese Patent Application Publication (KOKAI) No. 2003-272860, and can achieve the similar effect.

EXAMPLES

Hereinbelow, in the following Examples of the present invention and Comparative Examples, the procedure for manufacturing respective color light-emitting organic electroluminescent elements constituting a full color display device is described, and then the results of evaluation of them are shown.

Respective color electroluminescent elements 21r, 21g, 21b constituting a display device were individually prepared in accordance with the method of the present invention as follows (see FIGS. 1 to 3).

[Preparation of Red Electroluminescent Element 21r]

(a) First, on a glass substrate 1 which is a substrate for device, an APC (Ag—Pd—Cu) layer (thickness: 120 nm) which is a silver alloy layer, and a transparent conductive layer (thickness: 10 nm) composed of ITO were deposited in this order to form a pattern of a bottom electrode 3 having a two-layer structure as an anode. Then, an insulating film 5 of silicon oxide having a thickness of about 2 µm was deposited by a sputtering process so that the insulating film covered the edges of the patterned bottom electrode 3, and the bottom electrode 3 was exposed by a lithography technique to form pixel regions. m-MTDATA was deposited on the resultant surface by vapor deposition to form a hole injection layer 7 having a thickness of 10 nm. Then, α-NPD was deposited by vapor deposition to form a hole transport layer 9 having a thickness of 35 nm.

(b) Separately, a transfer substrate 30r was prepared as follows. A light-heat conversion layer 33 composed of molybdenum having a thickness of 200 nm was first deposited on a glass substrate 31 by a general sputtering process. Then, an oxidation protecting layer 34 composed of silicon nitride $SiN_x$ having a thickness of 100 nm was deposited on the light-heat conversion layer 33 by a CVD process. Subsequently, a red transfer layer 35r, which is composed of α-NPD (α-naphthyl phenyl diamine) which is a hole transport material as a host material containing 2,6-bis[(4'-methoxydiphenylamino)styryl]-1,5-dicyanonaphthalene (BSN) as a red light-emitting guest material in an amount of 30% by weight, was deposited on the oxidation protecting layer by vacuum deposition.

(c) Then, the transfer substrate 30r prepared in the item (b) above was disposed on the substrate 1 for device so that the organic layers deposited on the individual substrates faced each other, and they were brought into contact with each other in vacuum. The thickness of the insulating film 5 maintained a gap as small as about 2 µm between the substrates. In this state, in the arrangement corresponding to a blue pixel region of the substrate 1 for device, the back surface of the transfer substrate 30r was irradiated with a laser beam having a wavelength of 800 nm, so that the red transfer layer 35r was heat-transferred from the transfer substrate 30r, thus forming a red light-emitting layer 11r having a hole transport property. The laser beam had a spot size of 300 µm×10 µm. The laser beam was scanned in the direction perpendicular to the longer side of the laser spot. The energy density was 1.8 J/cm².

(d) After the red light-emitting layer 11r having a hole transport property was transferred, the whole of the substrate having the layer transferred was heated for 30 minutes. In this case, α-NPD in the hole transport layer 9 has a glass transition temperature of 96° C. and ADN in the host material has a glass transition temperature of 109° C., and therefore a temperature for heating of 100° C. was employed.

(e) After the heating, an electron transport layer 13 was formed. 8-Hydroxyquinoline aluminum ($Alq_3$) was deposited by vapor deposition to form the electron transport layer 13 having a thickness of about 20 nm. Subsequently, LiF was deposited by vapor deposition to form an electron injection layer 17 having a thickness of about 0.3 nm (deposition rate: 0.01 nm/sec). Then, MgAg was deposited by vapor deposition to form a cathode serving as a top electrode 19 having a thickness of 10 nm, thus obtaining a red electroluminescent 21r.

[Preparation of Green Electroluminescent Element 21g]

In place of the transfer substrate 30r prepared in the item (b) above, a transfer substrate 30g similar thereto was prepared except that the red transfer layer 35r having a hole transport property was changed to a green transfer layer 35g having an electron transport property. Specifically, in place of the item (b) above, on an oxidation protecting layer 34 deposited on a light-heat conversion layer 33 deposited on a glass substrate 31, a green transfer layer 35g having an electron transport property, obtained by mixing a host material composed of ADN and a green light-emitting guest material composed of coumarin 6 in an amount of 5% by weight, was deposited by vacuum deposition. Thus, a transfer substrate 30g was prepared The procedure in the item (a) above up to the formation of a hole transport layer 9 was completed, and then the heat treatment in the item (d) was conducted, and the transfer in the items (b) and (c) for a green light-emitting layer 11g having an electron transport property was conducted, followed by formation of an electron transport layer 13 and others in the item (e), thus obtaining a green electroluminescent element 21g.

[Preparation of Blue Electroluminescent Element 21b]

In place of the transfer substrate 30r prepared in the item (b) above, a transfer substrate 30b similar thereto was prepared except that the red transfer layer 35r having a hole transport property was changed to a blue transfer layer 35b having an electron transport property. Specifically, in place of the item (b) above, on an oxidation protecting layer 34 deposited on a light-heat conversion layer 33 deposited on a glass substrate 31, a blue transfer layer 35b having an electron transport property, obtained by mixing a host material composed of ADN and a blue light-emitting guest material composed of DPAVBi in an amount of 2.5% by weight, was deposited by vacuum deposition. Thus, the transfer substrate 30b is prepared.

The procedure in the item (a) above up to the formation of a hole transport layer 9 was completed, and then the heat treatment in the item (d) was conducted, and the transfer in the items (b) and (c) for a blue light-emitting layer 11b having an electron transport property was conducted, followed by formation of an electron transport layer 13 and others in the item (e), thus obtaining a blue electroluminescent element 21b.

COMPARATIVE EXAMPLES

Respective color electroluminescent elements constituting a display device were individually prepared in substantially the same manner as in the above Examples except that only the procedure for heat treatment was changed.

Specifically, in the preparation of the red electroluminescent element, the procedure was changed so that the heat treatment was conducted after a hole transport layer was formed and a red light-emitting layer having a hole transport property was transferred. In the preparation of each of the green electroluminescent element and blue electroluminescent element, the procedure was changed so that a green light-emitting layer or blue light-emitting layer having an electron transport property was transferred after the heat treatment was conducted.

[Results of Evaluation]

With respect to each of the thus prepared respective color electroluminescent elements in the Examples and respective color electroluminescent elements in the Comparative Examples, a chromaticity (CIE-x, CIE-y) and a light emission efficiency were measured using a spectral emission luminance meter under conditions such that a current was applied at a constant current density of 10 mA/cm$^2$. In addition, a life test was conducted under conditions such that the current application was controlled so that the same color electroluminescent elements in the Examples and Comparative Examples respectively emitted light at the same luminance, and a luminance reduction ratio after a lapse of 100 hours was measured. The results are shown in Table 1 below.

TABLE 1

|  |  | CIE-x | CIE-y | Light emission efficiency (cd/A) | Luminance reduction ratio (%) 100 hr |
|---|---|---|---|---|---|
| Red electroluminescent element | Example | 0.64 | 0.32 | 8.56 | 12 |
|  | Comparative Example | 0.63 | 0.32 | 6.02 | 29 |
| Green electroluminescent element | Example | 0.22 | 0.66 | 23.20 | 15 |
|  | Comparative Example | 0.22 | 0.68 | 19.20 | 13 |
| Blue electroluminescent element | Example | 0.16 | 0.31 | 9.41 | 15 |
|  | Comparative Example | 0.16 | 0.33 | 6.40 | 17 |

The results shown in Table 1 have confirmed that, with respect to the red electroluminescent element, the electroluminescent element prepared in the Example is remarkably improved not only in light emission efficiency by about 40% but also in emission life in terms of a luminance reduction ratio, as compared to the electroluminescent element prepared in the Comparative Example.

With respect to each of the green electroluminescent element and the blue electroluminescent element, the results shown in Table 1 have confirmed that the electroluminescent element prepared in the Example is improved in light emission efficiency, as compared to the electroluminescent element prepared in the Comparative Example, and that the luminance reduction ratio in the Example is similar to that in the Comparative Example.

The above results have confirmed that, when a display device is manufactured by the method of the present invention, there can be obtained a full color display device having improved display performance such that the light emission efficiency is improved while maintaining long brightness-half-life with respect to all of the red electroluminescent element, green electroluminescent element, and blue electroluminescent element using materials having different properties.

As described above, in the present invention, the emission region side of each light emitting layer can be planarized irrespective of charge transport property, and hence, in the display device composed of a plurality of electroluminescent elements having different material properties arranged on a substrate, both high light emission efficiency and long brightness-half-life can be maintained according to the properties of the individual electroluminescent elements. Therefore, even when the light emitting layers are formed by a heat transfer method which, for example, has excellent positioning precision but has lower light emission properties, the resultant electroluminescent elements can individually maintain both high light emission efficiency and long brightness-half-life. This makes it possible to achieve a display device using further scaled-down organic electroluminescent elements and having improved display properties.

It should be understood by those skilled in the art that various modifications, combinations, sub-combinations and alterations may occur depending on design requirements and other factors insofar as they are within the scope of the appended claims or the equivalents thereof.

CROSS REFERENCES TO RELATED APPLICATIONS

The present document contains subject matter related to Japanese Patent Application JP 2006-207663 filed in the Japanese Patent Office on Jul. 31, 2006, the entire contents of which being incorporated herein by reference.

What is claimed is:

1. A method for manufacturing a display device, comprising the steps of:
    forming a bottom electrode for supplying a first charge, in individual pixels on a substrate;
    forming a hole injection layer over the bottom electrode;
    forming a hole transport layer over the hole injection layer;
    forming a pattern of a first light-emitting layer having a first-charge transport property above the bottom electrode in part of the pixels;
    subjecting the substrate having the first light-emitting layer formed thereon to heat treatment, so as to planarize exposed surfaces of the first light-emitting layer and of the hole transport layer, the top surface of the first light-emitting layer serving as an emission region;
    forming a pattern of a second light-emitting layer having a second-charge transport property on the heat-treated surface above the bottom electrode in another part of the pixels, a lower surface of the second light-emitting layer, which serves as an emission region, is planarized due to being formed on the planarized exposed surface of the hole transport layer; and
    forming a top electrode for supplying a second charge so that the first light-emitting layer and the second light-emitting layer are sandwiched between the bottom electrode and the top electrode.

2. The method according to claim 1, wherein each of the formation of the pattern of the first light-emitting layer and the formation of the pattern of the second light-emitting layer is conducted by a transfer method.

3. The method according to claim 1, wherein the heat treatment is conducted at a temperature which is lower than a melting temperature of an organic material constituting the first light-emitting layer, and which is near a glass transition temperature of the organic material.

4. The method according to claim 1, further comprising the step of, after forming the bottom electrode and before forming the pattern of the first light-emitting layer, forming a first-charge transport layer on the bottom electrode,
    wherein
    the heat treatment is conducted at a temperature lower than the melting temperature of an organic material constituting the first-charge transport layer.

5. The method according to claim 1, further comprising the step of, after forming the second light-emitting layer and before forming the top electrode, forming a second-charge transport layer on the first light-emitting layer and the second light-emitting layer.

6. The method according to claim 1, wherein:
    the first charge is a positive charge and the bottom electrode is formed as an anode, and
    the second charge is a negative charge and the top electrode is formed as a cathode.

* * * * *